US012812946B2

(12) United States Patent
Lai et al.

(10) Patent No.: US 12,812,946 B2
(45) Date of Patent: Nov. 24, 2026

(54) MANUFACTURING METHOD OF SEMICONDUCTOR STRUCTURE WITH PATTERNED SILICON OXYCARBONITRIDE MASK LAYER

(71) Applicant: UNITED MICROELECTRONICS CORP., Hsin-Chu City (TW)

(72) Inventors: Pi-Hsuan Lai, Kaohsiung City (TW); Guo-Ping Li, Tainan City (TW); Chih-Wei Chang, Tainan City (TW); Bin-Siang Tsai, Changhua County (TW); Tzu-Chin Wu, Chiayi County (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 298 days.

(21) Appl. No.: 18/777,505

(22) Filed: Jul. 18, 2024

(65) Prior Publication Data

US 2025/0391661 A1 Dec. 25, 2025

(30) Foreign Application Priority Data

Jun. 19, 2024 (TW) ................................ 113122639

(51) Int. Cl.
*H10D 64/01* (2025.01)
*H10P 76/40* (2026.01)

(52) U.S. Cl.
CPC ........... *H10D 64/017* (2025.01); *H10D 64/01* (2025.01); *H10D 64/013* (2026.01); *H10P 76/405* (2026.01)

(58) Field of Classification Search
CPC ....... H10D 30/01; H10D 30/019–0198; H10D 30/024; H10D 30/0273; H10D 30/0285;
(Continued)

(56) References Cited

U.S. PATENT DOCUMENTS 8,334,198 B2 12/2012 Chen
9,263,252 B2 2/2016 Chang
(Continued)

FOREIGN PATENT DOCUMENTS

CN 109637979 A 4/2019
TW 449837 8/2001

*Primary Examiner* — Cheung Lee
(74) *Attorney, Agent, or Firm* — Winston Hsu

(57) ABSTRACT

A manufacturing method of a semiconductor structure includes the following steps. An oxide layer and a dummy gate are formed on a semiconductor substrate, and the oxide layer is located between the dummy gate and the semiconductor substrate in a vertical direction. A spacer is formed on a sidewall of the dummy gate and a sidewall of the oxide layer. An interlayer dielectric layer is formed on the semiconductor substrate, and the interlayer dielectric layer surrounds the spacer, the dummy gate, and the oxide layer in a horizontal direction. A patterned silicon oxycarbonitride mask layer is formed on the interlayer dielectric layer and the spacer. A removing process is performed for removing the dummy gate and the oxide layer and forming a trench surrounded by the spacer and the interlayer dielectric layer. The patterned silicon oxycarbonitride mask layer covers the interlayer dielectric layer and the spacer during the removing process.

11 Claims, 5 Drawing Sheets

(58) Field of Classification Search
CPC .. H10D 30/0293; H10D 64/01; H10D 64/011; H10D 64/013; H10D 64/017; H10P 50/69; H10P 50/71; H10P 50/73; H10P 76/40; H10P 76/405; H10P 76/408
See application file for complete search history.

(56) References Cited

U.S. PATENT DOCUMENTS

| | | | | |
|---|---|---|---|---|
| 2012/0264281 | A1* | 10/2012 | Chen | H10D 30/0227<br>438/591 |
| 2013/0307079 | A1 | 11/2013 | Jagannathan | |
| 2015/0364574 | A1 | 12/2015 | Kim | |
| 2018/0069091 | A1 | 3/2018 | Mulfinger | |
| 2018/0294334 | A1 | 10/2018 | Chan | |
| 2020/0111802 | A1 | 4/2020 | Huang | |
| 2023/0010065 | A1* | 1/2023 | Chiu | H10D 30/014 |

* cited by examiner

MANUFACTURING METHOD OF SEMICONDUCTOR STRUCTURE WITH PATTERNED SILICON OXYCARBONITRIDE MASK LAYER

BACKGROUND OF THE INVENTION

1. Field of the Invention

The present invention relates to a manufacturing method of a semiconductor structure, and more particularly, to a manufacturing method of a semiconductor structure including a gate structure.

2. Description of the Prior Art

The development of semiconductor integrated circuit technology progresses continuously and circuit designs in products of the new generation become smaller and more complicated than those of the former generation. The amount and the density of the functional devices in each chip region are increased constantly according to the requirements of innovated products, and the size of each device has to become smaller accordingly. In the conventional manufacturing process, polysilicon is generally used as a gate electrode in semiconductor devices, such as the metal-oxide-semiconductor (MOS). With the trend towards scaling down the size of semiconductor devices, however, conventional poly-silicon gates face problems such as inferior performance due to boron penetration and unavoidable depletion effects. This increases equivalent thickness of the gate dielectric layer, reduces gate capacitance and worsens a driving force of the devices. Therefore, work function metals that are suitable for use as the high-k gate dielectric layer are used to replace the conventional polysilicon gate. Generally, metal gate stack structures including the work function metal and the high-k gate dielectric layer are formed by a replacement metal gate (RMG) process. However, when gate electrodes of transistors with different types and/or different structures have to be formed on the same wafer or the same chip by the RMG process, the manufacturing processes corresponding to different transistor structures will influence each other to cause defects and affect related manufacturing yield.

SUMMARY OF THE INVENTION

A manufacturing method of a semiconductor structure is provided in the present invention. A patterned silicon oxycarbonitride mask layer is used to cover an interlayer dielectric layer and a spacer during a process of removing a dummy gate and an oxide layer for protecting the interlayer dielectric layer and enhancing manufacturing yield.

According to an embodiment of the present invention, a manufacturing method of semiconductor structure is provided. The manufacturing method includes the following steps. An oxide layer and a dummy gate are formed on a semiconductor substrate, and the oxide layer is located between the dummy gate and the semiconductor substrate in a vertical direction. A spacer is formed on a sidewall of the dummy gate and a sidewall of the oxide layer. An interlayer dielectric layer is formed on the semiconductor substrate, and the interlayer dielectric layer surrounds the spacer, the dummy gate, and the oxide layer in a horizontal direction. A patterned silicon oxycarbonitride mask layer is formed on the interlayer dielectric layer and the spacer. A removing process is performed for removing the dummy gate and the oxide layer and forming a trench surrounded by the spacer and the interlayer dielectric layer, and the patterned silicon oxycarbonitride mask layer covers the interlayer dielectric layer and the spacer during the removing process.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-5 are schematic drawings illustrating a manufacturing method of a semiconductor structure according to an embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, and FIG. 5 is a schematic drawing in a step subsequent to FIG. 4.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The term "etch" is used herein to describe the process of patterning a material layer so that at least a portion of the material layer after etching is retained. When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
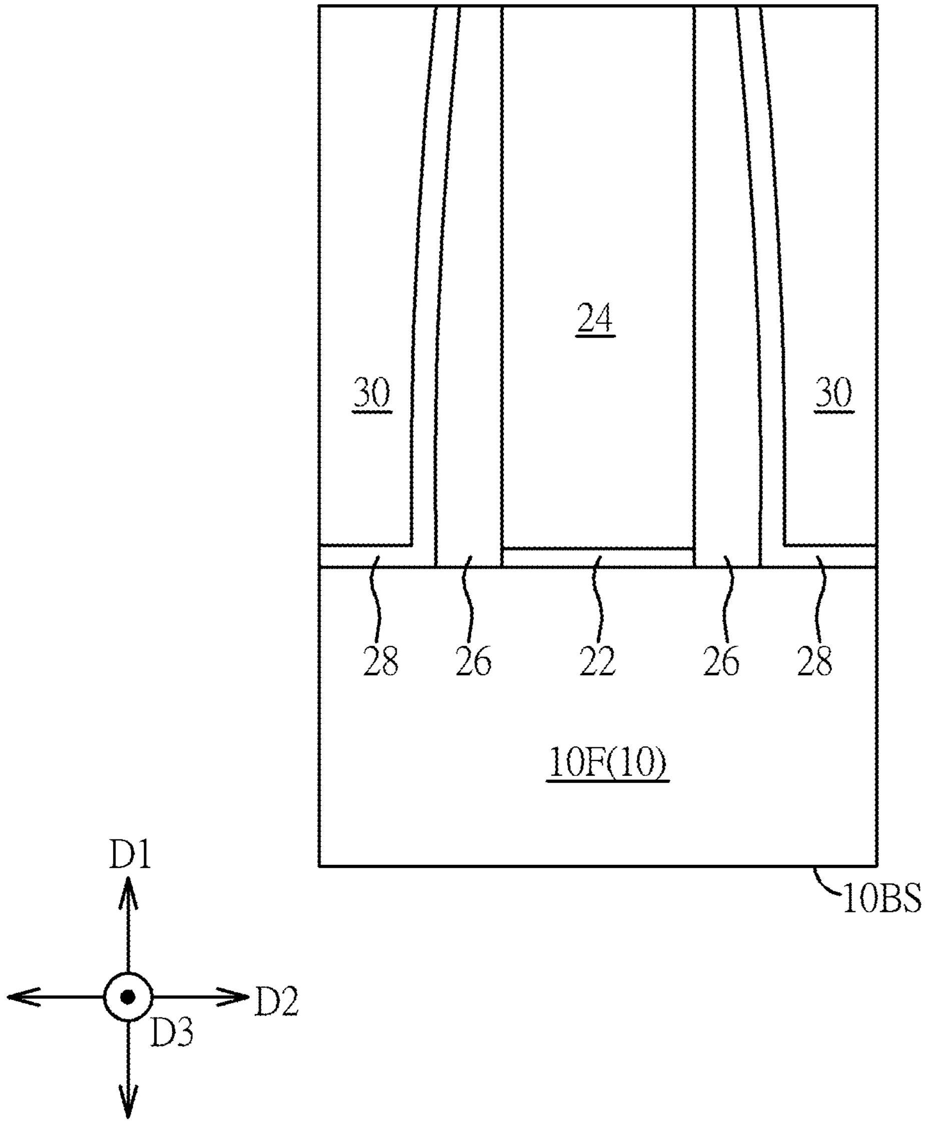
Figure 2:
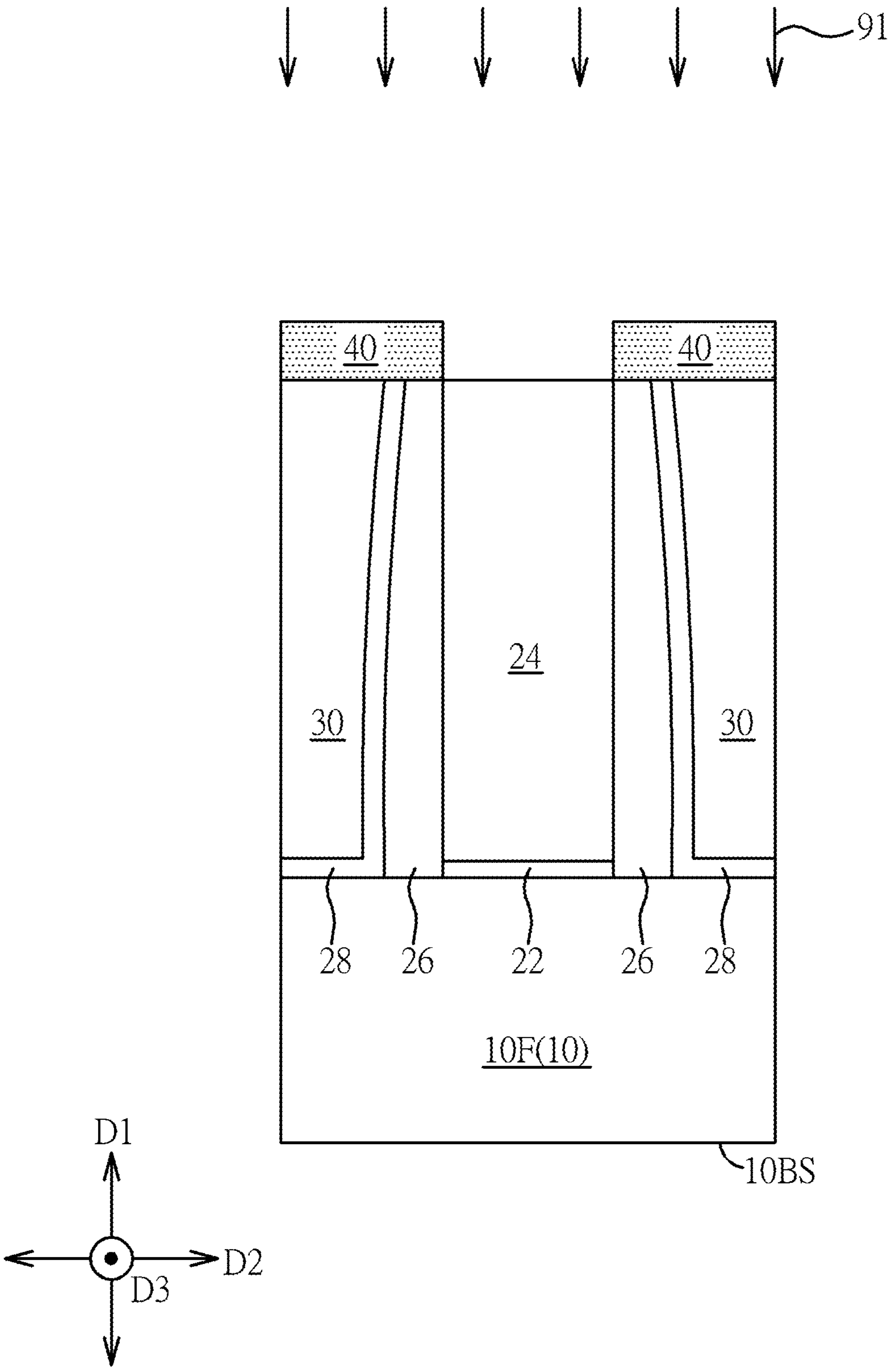
Figure 3:
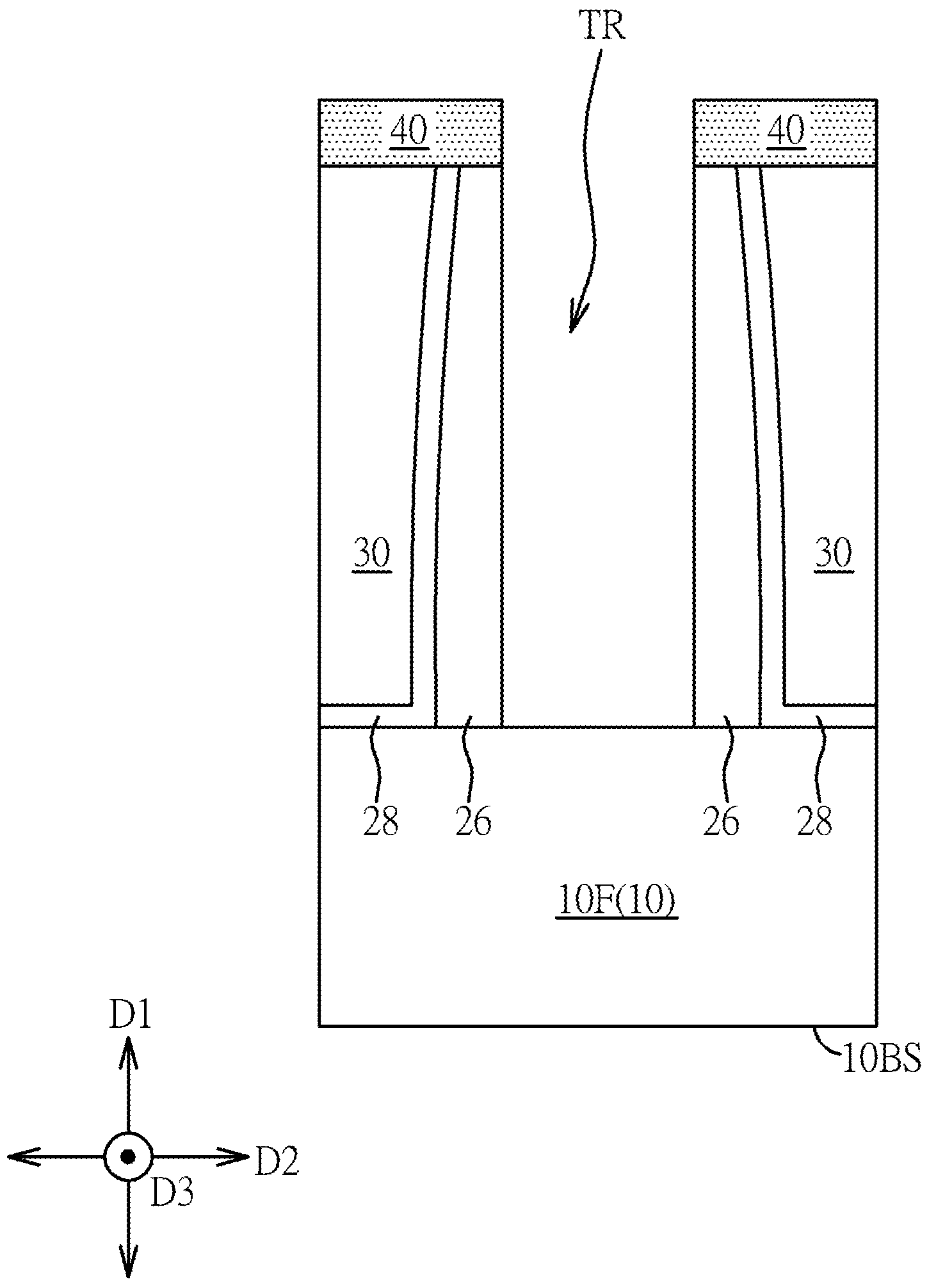
Figure 4:
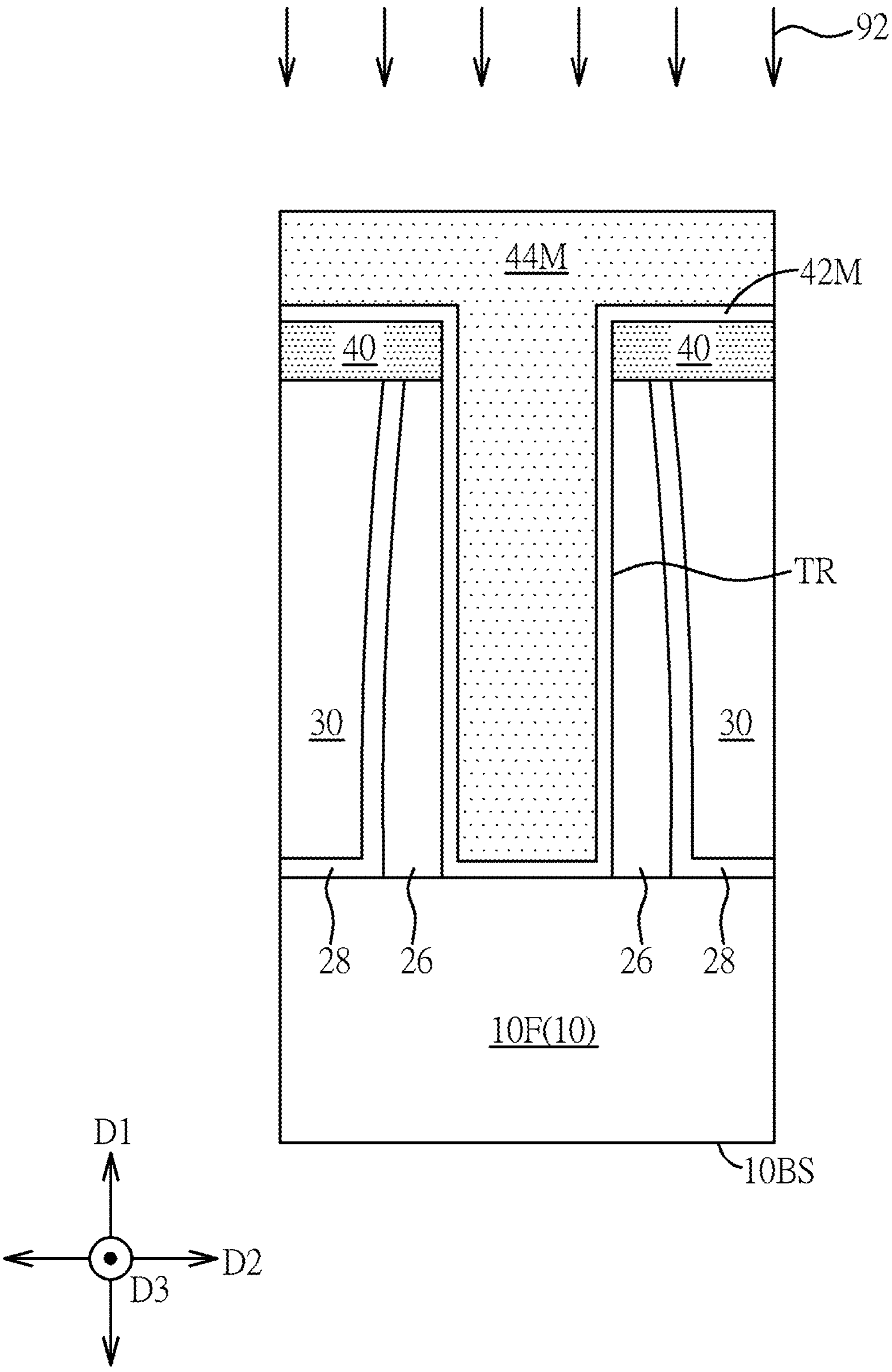
Figure 5:
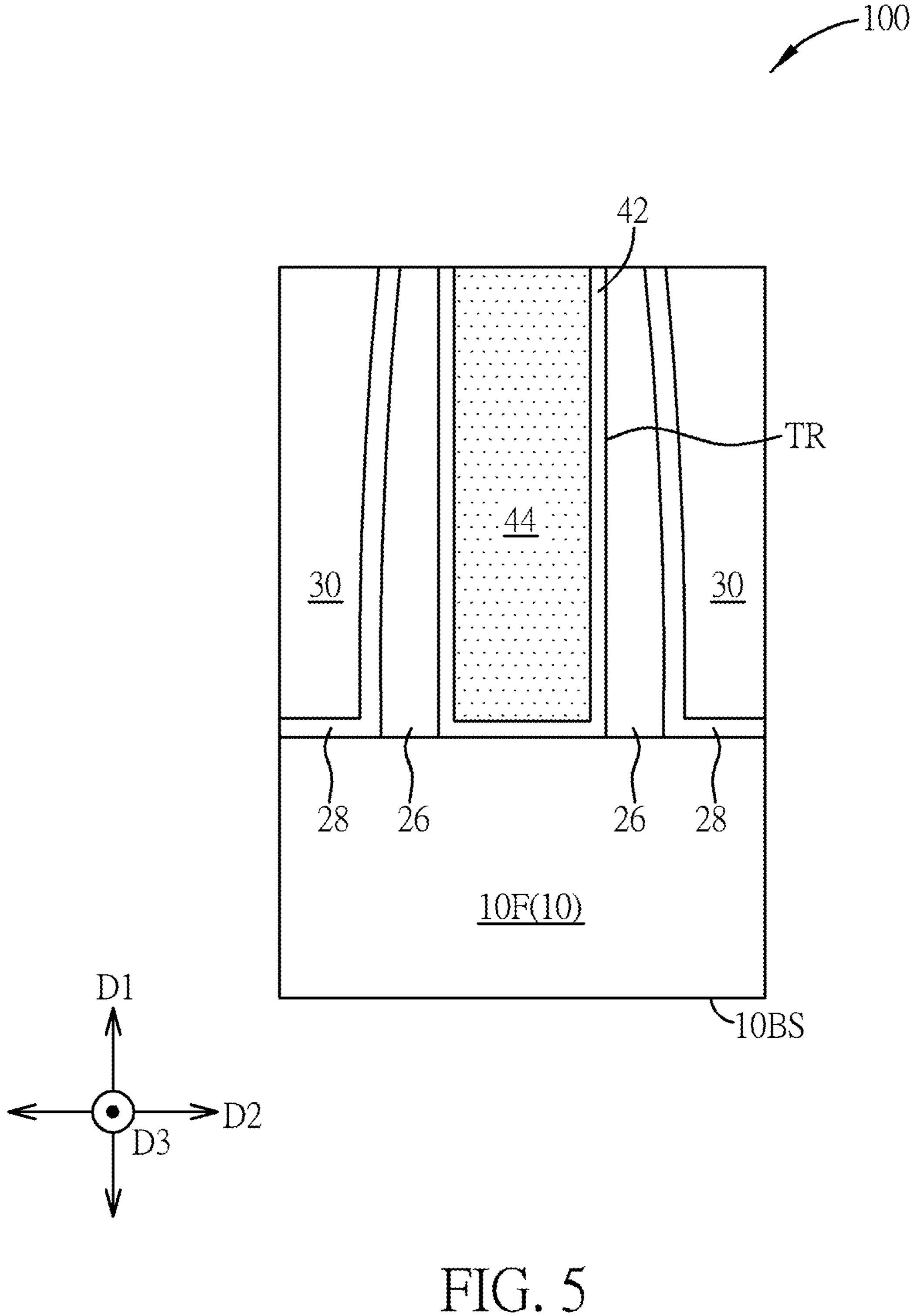

Please refer to FIGS. 1-5. FIGS. 1-5 are schematic drawings illustrating a manufacturing method of a semiconductor structure according to an embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, and FIG. 5 is a schematic drawing in a step subsequent to FIG. 4. The manufacturing method of the semiconductor structure in this embodiment includes the following steps. As shown in FIG. 1, an oxide layer 22 and a dummy gate 24 are formed on a semiconductor substrate 10, and the oxide layer 22 is located between the dummy gate 24 and the semiconductor substrate 10 in a vertical direction D1. A spacer 26 is formed on a sidewall of the dummy gate 24 and a sidewall of the oxide layer 22. An interlayer dielectric layer 30 is formed on the semiconductor substrate 10, and the interlayer dielectric layer 30 surrounds the spacer 26, the dummy gate 24, and the oxide layer 22 in a horizontal direction D2. Subsequently, as shown in FIG. 2 and FIG. 3, a patterned silicon oxycarbonitride (SiOCN) mask layer 40 is formed on the interlayer dielectric layer 30 and the spacer 26, a removing process 91 is performed for removing the dummy gate 24 and the oxide layer 22 and forming a trench TR surrounded by the spacer 26 and the interlayer dielectric layer 30, and the patterned silicon oxycarbonitride mask layer 40 covers the interlayer dielectric layer 30 and the spacer 26 during the removing process 91.

In some embodiments, the semiconductor substrate 10 may include a silicon substrate, a silicon-on-insulator (SOI) substrate, or a substrate made of other suitable materials. A fin-shaped structure 10F may be formed by performing a patterning process to the semiconductor substrate 10, and the fin-shaped structure 10F may include the semiconductor material (such as silicon but not limited thereto) in the semiconductor substrate 10 accordingly. In some embodiments, the fin-shaped structure 10F may protrude upwards in the vertical direction D1 and extend in a horizontal direction (such as the horizontal direction D2, but not limited thereto), and the oxide layer 22 and the dummy gate 24 may extend in another horizontal direction (such as a horizontal direction D3 orthogonal to the horizontal direction D2, but not limited thereto) and be disposed straddling the fin-shaped structure 10F, but not limited thereto. In some embodiments, the vertical direction D1 may be regarded as a thickness direction of the semiconductor substrate 10. The semiconductor substrate 10 may have a top surface and a bottom surface 10BS opposite to the top surface in the vertical direction D1, and the oxide layer 22, the dummy gate 24, the spacer 26, and the interlayer dielectric layer 30 described above may be disposed at the side of the top surface. A horizontal direction substantially orthogonal to the vertical direction D1 (such as the horizontal direction D2, the horizontal direction D3, and other directions orthogonal to the vertical direction D1) may be substantially parallel with the bottom surface 10BS of the semiconductor substrate 10, but not limited thereto. Additionally, in this description, a top surface of a specific component may include the topmost surface of this component in the vertical direction D1, and a bottom surface of a specific component may include the bottommost surface of this component in the vertical direction D1, but not limited thereto. In this description, the condition that a certain component is disposed between two other components in a specific direction may include but is not limited to a condition that the certain component is sandwiched between the two other components in the specific direction.

The manufacturing method in this embodiment may include but is not limited to the following steps. As shown in FIG. 1, in some embodiments, an etching stop layer 28 may be formed on the substrate 10 after the spacer 26 is formed and before the interlayer dielectric layer 30 is formed. The etching stop layer 28 may be formed on a sidewall of the spacer 26 and on the top surface of the semiconductor substrate 10, and the interlayer dielectric layer 30 may be formed on the etching stop layer 28. In some embodiments, an etching stop material and an interlayer dielectric material may be formed sequentially and cover the dummy gate 24 and the spacer 26 after the spacer 26 is formed, and a planarization process (such as but is not limited to a chemical mechanical polishing process) may be performed for removing the interlayer dielectric layer and the etching stop material covering the dummy gate 24 in the vertical direction D1, exposing the top surface of the dummy gate 24, and forming the etching stop layer 28 and the interlayer dielectric layer 30. Therefore, the top surface of the interlayer dielectric layer 30, the top surface of the etching stop layer 28, the top surface of the spacer 26, and the top surface of the dummy gate 24 may be substantially coplanar, but not limited thereto. Additionally, in some embodiments, corresponding source/drain structures and/or doped regions may be formed in the semiconductor substrate 10 before the etching stop layer 28 is formed, but not limited thereto. In some embodiments, the oxide layer 22 may include silicon oxide or other suitable oxide dielectric materials, the dummy gate may include polysilicon or other suitable materials, and the spacer 26 may include a single layer or multiple layers of dielectric materials (such as silicon oxycarbonitride, silicon nitride, or other suitable dielectric materials). The etching stop layer 28 may include nitrogen doped carbide (NDC, such as nitrogen doped silicon carbide), silicon nitride, silicon oxycarbide (SiOC), or other suitable dielectric materials, and the interlayer dielectric layer 30 may include silicon oxide or other suitable dielectric materials.

As shown in FIG. 2, the patterned silicon oxycarbonitride mask layer 40 may be formed on the top surfaces of the interlayer dielectric layer 30, the etching stop layer 28, and the spacer 26. In some embodiments, a method of forming the patterned silicon oxycarbonitride mask layer 40 may include an atomic layer deposition (ALD) process or other suitable approaches. For example, a silicon oxycarbonitride mask layer may be formed on the top surfaces of the interlayer dielectric layer 30, the etching stop layer 28, the spacer 26, and the dummy gate 24 by an ALD process, a patterning process may then be performed to this silicon oxycarbonitride mask layer, and the silicon oxycarbonitride mask layer may be patterned to be the patterned silicon oxycarbonitride mask layer 40. The patterning process described above may include a photolithographic and etching process or other suitable patterning approaches for removing at least a part of the silicon oxycarbonitride mask layer formed above the dummy gate 24 and exposing the dummy gate 24. It is worth noting that, in this invention, the atomic percent of each element in the patterned silicon oxycarbonitride mask layer 40 may be controlled by adjusting the process parameters of the process of forming the silicon oxycarbonitride mask layer (such as the ALD process, but not limited thereto) so that the patterned silicon oxycarbonitride mask layer 40 may have the required material properties, and the patterned silicon oxycarbonitride mask layer 40 may be regarded as a tunable mask layer accordingly.

For example, the patterned silicon oxycarbonitride mask layer 40 may be used to protect the interlayer dielectric layer 30 in the removing process configured to remove the dummy gate 24 and the oxide layer 22, the etching rate of the patterned silicon oxycarbonitride mask layer 40 has to be relatively low in the removing process, and the etching rate in the removing process may be lowered by relatively reducing oxygen concentration in the patterned silicon oxycarbonitride mask layer 40 and/or relatively increasing nitrogen concentration and carbon concentration in the patterned silicon oxycarbonitride mask layer 40, but not limited thereto. Additionally, in some embodiments, the patterned silicon oxycarbonitride mask layer 40 may be removed by a planarization process (such as but not limited to a chemical mechanical polishing process) performed to a material for forming a metal gate together, so as to simplify related process steps, and the material of the patterned silicon oxycarbonitride mask layer 40 needs to not have negative influence on this planarization process accordingly. In some embodiments, an atomic percent of silicon in the patterned silicon oxycarbonitride mask layer 40 may be higher than an atomic percent of oxygen in the patterned silicon oxycarbonitride mask layer 40, an atomic percent of carbon in the patterned silicon oxycarbonitride mask layer 40, and an atomic percent of nitrogen in the patterned silicon oxycarbonitride mask layer 40, respectively. For instance, the atomic percent of silicon, the atomic percent of oxygen, the atomic percent of carbon, and the atomic percent of nitrogen in the patterned silicon oxycarbonitride mask layer 40 may be 37.2%, 32.2%, 8.5%, and 22.1%, respectively, and the etching rate of the patterned silicon oxycarbonitride mask layer 40 with this material composition in the wet etching and/or the wet cleaning process for removing oxide (such as but not limited to a wet process using $NF_3$ and HF with process temperature substantially equal to 60 degrees Celsius) may be relatively low (for example, an etched thickness after a process time equal to 31.1 seconds may be about 3.2 angstroms), but not limited thereto.

In some embodiments, the atomic percent of carbon in the patterned silicon oxycarbonitride mask layer 40 and the etching rate of the patterned silicon oxycarbonitride mask layer 40 in the wet process described above may have a negative correlation substantially. In other words, the etching rate becomes lower when the atomic percent of carbon becomes higher. In addition, the etching rate may become extremely low when the atomic percent of carbon in the patterned silicon oxycarbonitride mask layer 40 is equal to about 9%, and there is not any negative influence of the patterned silicon oxycarbonitride mask layer 40 having the atomic percent of carbon ranging from 0.6% to 9% on the planarization process. Therefore, the atomic percent of carbon in the patterned silicon oxycarbonitride mask layer 40 may be lower than or equal to 9%, and the atomic percent of carbon in the patterned silicon oxycarbonitride mask layer 40 may range from 8% to 9% preferably for providing the required protection performance by the patterned silicon oxycarbonitride mask layer 40, but not limited thereto. Relatively, the atomic percent of oxygen in the patterned silicon oxycarbonitride mask layer 40 may be lower than 40%, and the atomic percent of nitrogen in the patterned silicon oxycarbonitride mask layer 40 may be higher than 20%, but not limited thereto. Additionally, in some embodiments, the atomic percent of oxygen in the silicon oxycarbonitride mask layer may be reduced by reducing the time of introducing oxidizing agent in the ALD process of forming the silicon oxycarbonitride mask layer described above, but not limited thereto.

As shown in FIG. 2 and FIG. 3, the removing process 91 may be performed after the patterned silicon oxycarbonitride mask layer 40 is formed for removing the dummy gate 24 and the oxide layer 22 and forming the trench TR, and the patterned silicon oxycarbonitride mask layer 40 may cover the interlayer dielectric layer 30, the etching stop layer 28, and the spacer 26 during the removing process 91 and after the removing process 91. In some embodiments, the removing process 91 may include one or a plurality of etching processes for completely removing the dummy gate 24 and the oxide layer 22, respectively, and the etching rate of the patterned silicon oxycarbonitride mask layer 40 in the etching process for removing the oxide layer 22 is lower than the etching rate of the oxide layer 22 in this etching process for providing the required protection performance. Subsequently, as shown in FIGS. 3-5, a gate dielectric layer 42 and a gate structure 44 may be formed in the trench TR, and a method of forming the gate dielectric layer 42 and the gate structure 44 may include but is not limited to the following steps. As shown in FIG. 4, a dielectric material 42M may be formed and an electrically conductive material 44M may be formed on the dielectric material 42M, and the dielectric material 42M is formed before the electrically conductive material 44M is formed. In some embodiments, the dielectric material 42M may include a high dielectric constant (high-k) dielectric material or other suitable dielectric materials, and the high-k dielectric material may include but is not limited to hafnium oxide ($HfO_2$), hafnium silicon oxide ($HfSiO_4$), hafnium silicon oxynitride (HfSiON), aluminum oxide ($Al_2O_3$), tantalum oxide ($Ta_2O_5$), or zirconium oxide ($ZrO_2$). The electrically conductive material 44M may include an electrically conductive metal stack structure, such as including a single layer or multiple layers of work function layers (not illustrated) and a low electrical resistivity layer (not illustrated) disposed on the work function layer. The work function layer may include titanium nitride, titanium carbide, tantalum nitride, tantalum carbide, tungsten carbide, titanium tri-aluminide, aluminum titanium nitride, or other suitable electrically conductive work function materials, and the low electrical resistivity layer may include tungsten, aluminum, copper, titanium aluminide, titanium, or other suitable materials with low electrical resistivity.

As shown in FIG. 4 and FIG. 5, the dielectric material 42M and the electrically conductive material 44M may be partly formed in the trench TR and partly formed outside the trench TR, and a planarization process 92 may be performed after the dielectric material 42M and the electrically conductive material 44M are formed for removing the dielectric material 42M formed outside the trench TR and the electrically conductive material 44M formed outside the trench TR. The dielectric material 42M and the electrically conductive material 44M remaining in the trench TR after the planarization process 92 may become the gate dielectric layer 42 and the gate structure 44, respectively. In some embodiments, the planarization process 92 may include a chemical mechanical polishing process or other suitable planarization approaches. A part of the interlayer dielectric layer 30, a part of the etching stop layer 28, and a part of the spacer 26 may be removed by the planarization process 92, and the patterned silicon oxycarbonitride mask layer 40 may be completely removed by the planarization process 92. After the planarization process 92, the top surface of the interlayer dielectric layer 30, the top surface of the etching stop layer 28, the top surface of the spacer 26, and the top surface of the gate structure 44 may be substantially coplanar, but not limited thereto. In addition, the gate structure 44 may be a metal gate structure, and the manufacturing method described in FIGS. 2-5 may be regarded as a replacement metal gate (RMG) process. By using the patterned silicon oxycarbonitride mask layer 40 protecting the interlayer dielectric layer 30 in the step of removing the dummy gate 24 and the oxide layer 22, the interlayer dielectric layer 30 may be kept from being etched and related issues such as metal residue in the subsequent process (such the electrically conductive material 44M remaining on the interlayer dielectric layer 30) may be avoided, and the condition of controlling the height of the gate structure 44 may be improved and/or the related manufacturing yield may be enhanced accordingly. In addition, the material characteristics of the patterned silicon oxycarbonitride mask layer 40 additionally formed may be modified by adjusting the process condition of forming the patterned silicon oxycarbonitride mask layer 40, and the patterned silicon oxycarbonitride mask layer 40 may be used as an effective etching mask without generating negative influence on the subsequent processes accordingly.

A semiconductor structure 100 illustrated in FIG. 5 may be formed by the manufacturing method described above. In some embodiments, the semiconductor structure 100 may include at least a portion of a semiconductor field effect transistor formed on a first region (such as a core region, but not limited thereto), and the oxide layer described above may be further formed on a second region (such as an IO region, but not limited thereto) and used as at least a portion of a gate oxide layer in another transistor structure. Therefore, in the removing process 91 shown in FIG. 2, the patterned silicon oxycarbonitride mask layer 40 may further cover the second region for keeping the oxide layer located above the second region after the removing process 91, and the oxide layer 22 illustrated in FIG. 2 may also be regarded as an IO oxide layer, but not limited thereto.

To summarize the above descriptions, in the manufacturing method of the semiconductor structure according to the present invention, the patterned silicon oxycarbonitride mask layer may be used to protect the interlayer dielectric layer during the steps of removing the dummy gate and the oxide layer, and the proportions of the elements in the patterned silicon oxycarbonitride mask layer may be modified for avoiding negative influence on other subsequent processes and keeping the required protection performance of the patterned silicon oxycarbonitride mask layer. Therefore, the condition of controlling the height of the gate structure may be improved and/or the related manufacturing yield may be enhanced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor structure, comprising:

forming an oxide layer and a dummy gate on a semiconductor substrate, wherein the oxide layer is located between the dummy gate and the semiconductor substrate in a vertical direction;

forming a spacer on a sidewall of the dummy gate and a sidewall of the oxide layer;

forming an interlayer dielectric layer on the semiconductor substrate, wherein the interlayer dielectric layer surrounds the spacer, the dummy gate, and the oxide layer in a horizontal direction;

forming a patterned silicon oxycarbonitride mask layer on the interlayer dielectric layer and the spacer; and performing a removing process for removing the dummy gate and the oxide layer and forming a trench surrounded by the spacer and the interlayer dielectric layer, wherein the patterned silicon oxycarbonitride mask layer covers the interlayer dielectric layer and the spacer during the removing process, and an atomic percent of silicon in the patterned silicon oxycarbonitride mask layer is higher than an atomic percent of oxygen in the patterned silicon oxycarbonitride mask layer.

2. The manufacturing method of the semiconductor structure according to claim 1, wherein the atomic percent of silicon in the patterned silicon oxycarbonitride mask layer is higher than an atomic percent of carbon in the patterned silicon oxycarbonitride mask layer and an atomic percent of nitrogen in the patterned silicon oxycarbonitride mask layer, respectively.

3. The manufacturing method of the semiconductor structure according to claim 1, wherein an atomic percent of carbon in the patterned silicon oxycarbonitride mask layer is lower than or equal to 9%.

4. The manufacturing method of the semiconductor structure according to claim 3, wherein the atomic percent of carbon in the patterned silicon oxycarbonitride mask layer ranges from 8% to 9%.

5. The manufacturing method of the semiconductor structure according to claim 1, wherein the atomic percent of oxygen in the patterned silicon oxycarbonitride mask layer is lower than 40%.

6. The manufacturing method of the semiconductor structure according to claim 1, wherein an atomic percent of nitrogen in the patterned silicon oxycarbonitride mask layer is higher than 20%.

7. The manufacturing method of the semiconductor structure according to claim 1, wherein a method of forming the patterned silicon oxycarbonitride mask layer comprises an atomic layer deposition (ALD) process.

8. The manufacturing method of the semiconductor structure according to claim 1, wherein a material of the spacer comprises silicon oxycarbonitride.

9. The manufacturing method of the semiconductor structure according to claim 1, wherein the removing process comprises an etching process for removing the oxide layer, and an etching rate of the patterned silicon oxycarbonitride mask layer in the etching process is lower than an etching rate of the oxide layer in the etching process.

10. The manufacturing method of the semiconductor structure according to claim 1, further comprising:

forming a gate structure in the trench, wherein a method of forming the gate structure comprises:

forming an electrically conductive material, wherein the electrically conductive material is partly formed in the trench and partly formed outside the trench; and performing a planarization process for removing the electrically conductive material formed outside the trench, wherein the patterned silicon oxycarbonitride mask layer is removed by the planarization process.

11. The manufacturing method of the semiconductor structure according to claim 10, further comprising:

forming a gate dielectric layer in the trench, wherein a method of forming the gate dielectric layer comprises:

forming a dielectric material before the electrically conductive material is formed, wherein the dielectric material is partly formed in the trench and partly formed outside the trench, and the dielectric material formed outside the trench is removed by the planarization process.

* * * * *